United States Patent
Gohara et al.

(10) Patent No.: US 6,646,429 B2
(45) Date of Patent: Nov. 11, 2003

(54) CURRENT DETECTION DEVICE, METHOD OF DETECTING ELECTRIC CURRENT AND POWER SUPPLY SYSTEM USING THE SAME

(75) Inventors: Takashi Gohara, Shizuoka-ken (JP); Yasuhiro Tamai, Shizuoka-ken (JP); Mitsuaki Morimoto, Shizuoka-ken (JP); Yoshinori Ikuta, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 160 days.

(21) Appl. No.: 09/930,947

(22) Filed: Aug. 17, 2001

(65) Prior Publication Data
US 2002/0041179 A1 Apr. 11, 2002

(30) Foreign Application Priority Data
Aug. 28, 2000 (JP) .......................................... 2000-257904

(51) Int. Cl.$^7$ ............................................. G01R 33/00
(52) U.S. Cl. ............................. 324/117 H; 324/117 R
(58) Field of Search .......................... 324/117 R, 117 H, 324/126, 127, 251, 252; 327/511; 338/32 H

(56) References Cited

U.S. PATENT DOCUMENTS

| | | | | |
|---|---|---|---|---|
| 3,312,898 A | * | 4/1967 | Browne, Jr. ............ | 324/117 R |
| 4,926,116 A | * | 5/1990 | Talisa .................... | 324/117 R |
| 6,512,359 B1 | * | 1/2003 | Tamai et al. ............ | 324/117 R |

FOREIGN PATENT DOCUMENTS

| JP | 59-79860 | 5/1984 |
|---|---|---|
| JP | 8-3499 | 10/1988 |

\* cited by examiner

*Primary Examiner*—Vinh P. Nguyen
*Assistant Examiner*—Minh N. Tang
(74) *Attorney, Agent, or Firm*—Finnegan, Henderson, Farabow, Garrett, & Dunner, L.L.P.

(57) ABSTRACT

A current detection device, a power supply system and a method for detecting electric current is disclosed as including an electric conductor 10 which has first, second and third conductor components 11, 12, 13 extending from a diverging point O in three orientations with a given angle with respect to one another, first and second magnet-electric transducer elements 21, 22 located at both sides of the first conductor component in positions equally spaced from the first conductor component and in the vicinity of the diverging point, and a calculation processor circuit responsive to a differential value between first and second electric signals produced by the first and second transducer elements for thereby detecting electric current flowing through the first conductor component.

4 Claims, 5 Drawing Sheets

CURRENT DETECTION DEVICE, METHOD OF DETECTING ELECTRIC CURRENT AND POWER SUPPLY SYSTEM USING THE SAME

BACKGROUND OF THE INVENTION

The present invention relates to a current detection device, a method for detecting electric current flowing through an electric circuit employed in an equipment such as an automotive vehicle, and a power supply system using the same.

In recent years, due to wide spread of electric vehicles and hybrid cars, etc., a highly sophisticated current detection device is demanded with a view to managing a charging or discharging state of a battery. It has heretofore been proposed to provide such a current detection device which employs a standard resistor to allow electric current to flow to cause a voltage drop which is measured to detect the magnitude of electric current. Such a current detection device encounters an increase in the size and weight of the standard resistor, with resultant remarkable increase in the amount of heat especially when electric current flowing through the standard resistor increases. Accordingly, the aforementioned current detection device is not suited for use in an electric junction box to perform distribution of electric power output in the automotive vehicle.

To address such an issue, it has heretofore been proposed to provide a current detection device adapted to detect electric current with the use of a current transformer and a Hall element of a magnetic reluctance type, a typical example of which is disclosed in Japanese Patent Provisional Publication No. 59-79860. The current detection device of such a type requires an annular core of a size to suit the magnitude of electric current to be measured, resulting in a difficulty caused in reducing the volumetric size and weight of the device.

To improve such a difficulty, it has also been proposed to provide a current detection device which detects electric current without the use of the magnetic core, an example of which is disclosed in Japanese Patent Publication No. 8-3499. This current detection device has a structure wherein a circuit substrate is formed with a central bore through which a linear electric conductor extends and wherein two magneto-electric transducer elements are located in a circumferential region around the central bore of the substrate for detecting electrical current. Electrical signals produced by the two transducer elements are synthesized, allowing the device to produce an output with the magnitude twice times that of the single magneto-electric transducer element.

SUMMARY OF THE INVENTION

However, since the magnitude of the output signal produced by such a current detection device is extremely low level, it is required for the current detection device to produce an output signal with a further increased level. With such a structure, further, a special advance work is required for passing the linear electric conductor to be measured through the circuit substrate, resulting in a poor workability of the current detection device in a mounting process. Also, in the current detection device equipped with the magneto-electric transducer elements, the presence of plural electric conductors accommodated in the electrical junction box renders the current detection device to suffer a difficulty in accurately detecting electric current owing to interference of magnetic flux disturbances caused by electric current flowing through the plural conductors.

It is therefore an object of the present invention to provide a current detection device, a method for detecting electric current and a power supply system using the same which enable electric current flowing through en electric conductor to be accurately detected and which provide an ease of assembling of the current detection device at a low cost.

According to a first aspect of the present invention, there is provided a current detection device which comprises an electric conductor placed in a plane and having first, second and third conductor components extending from a common diverging point in three orientations with a given angle with respect to one another, first and second magnet-electric transducer elements located at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor, and a calculation processor circuit responsive to a differential value between the first and second electric signals for thereby detecting electric current flowing through the first conductor component.

According to the first aspect of the present invention, the presence of the first and second magneto-electric transducer elements located at both sides of the first conductor component in the vicinity of the diverging point for enabling electric current flowing through the first conductor component to be detected on the basis of a differential value between first and second electric signals produced by the first and second magneto-electric transducer elements. Since, in this instance, each of the two magneto-electric transducer elements undergoes an influence of the magnetic fluxes caused by electric current flowing at a position upstream of the diverging point and electric current at a position downstream of the diverging point, each of the transducer elements performs magneto-electric conversion of a larger amount of magnetic fluxes than that of a case wherein electric current flows through the single linear conductor. As a result, even when the magnitude of electric current flowing through the first conductor component remains at a small value, it is possible to detect current with a high sensitivity.

Further, even when there are magnetic flux disturbances in the vicinity of the current detection device, the presence of the differential value between the electric signals of the two transducer elements renders cancellation of the magnetic flux disturbances. As a result, even when there are other electric conductors placed in juxtaposition with the first conductor component, the current detection device of the present invention does not suffer from the magnetic flux disturbances, with a resultant capability in highly accurately detecting electric current. Also, with the use of only two magneto-electric transducer elements, it is possible for the current detection device of the present invention to be manufactured at the same price as the state-of-the-art current detection device which also employs the two magneto-electric transducer elements. Further, in the current detection device of the present invention, there is no need for using the flux concentrator core, achieving a miniaturization, reduced weight and low manufacturing cost of the device.

According to a second aspect of the present invention, there is provided a method for detecting electric current, which comprises locating an electric conductor composed of first, second and third conductor components extending from a common diverging point in three orientations angled at a given angle with respect to one anther, locating first and second magnet-electric transducer elements at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor, and calculating a differential value between the first and second electric signals for thereby detecting electric current flowing through the first conductor component.

According to a third aspect of the present invention, there is provided a power supply system which comprises a current detection device including an electric conductor placed in a plane and having first, second and third conductor components extending from a common diverging point in three orientations with a given angle with respect to one another, first and second magnet-electric transducer elements located at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor, and a calculation processor circuit responsive to a differential value between the first and second electric signals for thereby detecting electric current flowing through the first conductor component, a battery electrically coupled to the first conductor component, a load electrically connected to the second conductor component, and an electric power generator coupled to the third conductor component, wherein the amount of electric power output of the electric power generator is controlled in response to charging and discharging current, detected by the calculation processor circuit, of the battery flowing through the first conductor component.

An important advantage of the power supply system of the present invention concerns a miniaturization and a low cost of the power supply system owing to the use of the current detection device in miniaturized size and low cost. Also, since it is possible to accurately detect charging and discharging current of the battery with the greatest sensitivity, the electric power generator is enabled to be accurately controlled to provide a desired amount of electric power output.

According to a fourth aspect of the present invention, there is provided a current detection device which comprises a T-shaped electric conductor including first, second and third conductor components formed in a unitary structure, first and second magnet-electric transducer elements located at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor, a sensor substrate including a calculation processor circuit responsive to a differential value between the first and second electric signals for thereby detecting electric current flowing through the first conductor component, and a case for accommodating the electric conductor, the first ad second magneto-electric transducer elements.

Since an assembly of the current detection device is carried out by merely assembling the T-shaped electric conductor, the first and second magneto-electric transducer elements and the sensor substrate into the case to allow the electric conductor and the sensors to be easily positioned in a high precision to enable an accurate detection of electric current.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
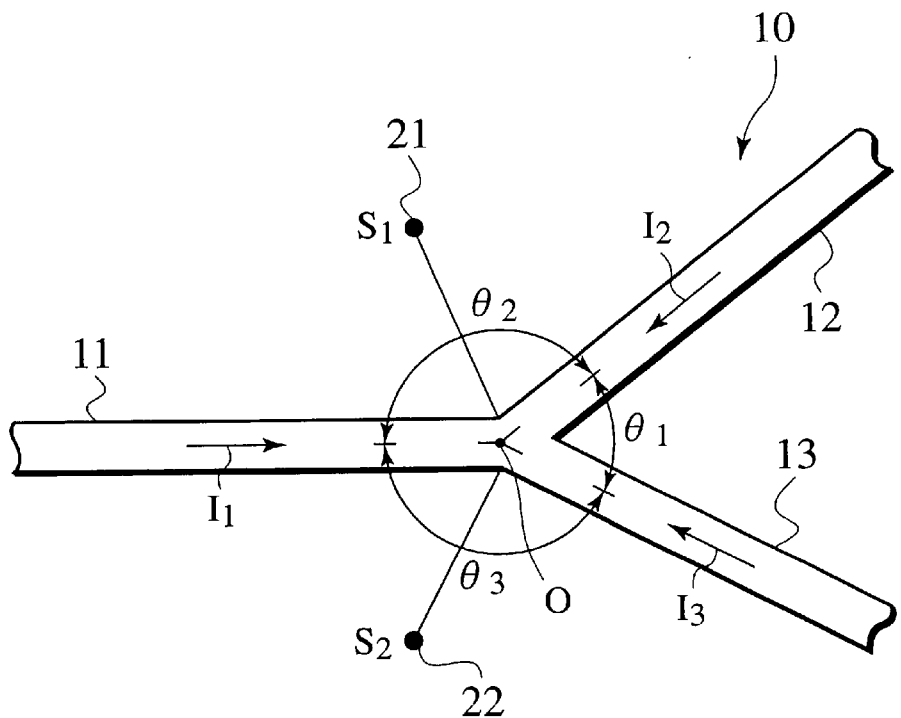
FIG. 1 is a schematic view of a structure of a part of a sensor section of a current detection device of a preferred embodiment according to the present invention.

To describe the present invention more in detail, a current detection device of preferred embodiments of the present invention and a current detecting method of the present invention will be explained with reference to the drawings below, with like parts bearing the same reference numerals throughout the drawings.

Referring now to FIG. 1, there is shown a schematic structure of a sensor section of a current detection device of a first preferred embodiment according to the present invention. The sensor section includes a three legged electrical conductor 10, and first and second Hall elements 21, 22, each of which includes a magneto-electric transducer element and serves as a sensor section. These components are accommodated in a common electrical junction box which will be described below in detail. In this illustrated embodiment, a flux concentration core is not employed.

As seen in FIG. 1, the three legged electrical conductor 10 includes a first center conductor component 11, a second bifurcated conductor component 12 and a third bifurcated conductor component 13 which are oriented on the same plane, at given angles, inclusive of a diverging point O in three orientations. Respective ends of the first, second and third conductor components 11, 12, 13 are joined together at the diverging point O.

The three legged electrical conductor 10 may be formed of three discrete conductor components such as the first, second and third conductor components whose respective ends are joined together at the diverging point O, or may be composed of a unitary construction having the first, second and third conductor components 11, 12, 13. Further, the three legged electrical conductor 10 may be formed on a circuit substrate whose surface is formed with a wiring pattern having the first, second and third conductor components 11, 12, 13.

First and second Hall elements 21, 22 are located on both sides of the first conductor component 11 in the vicinity of the diverging point O, and has respective flux sensitive surfaces (flux detecting surfaces) which respond to a flux density incident thereon to produce voltage (Hall voltage) signals. Each Hall element is supplied with electric current with a given magnitude through a lead (not shown), and each voltage signal produced by each Hall element is retrieved at outside via a lead (not shown).

Preferably, amounting position of each Hall element is decided in a manner described below. That is, the first Hall element 21 is located at a center point between the first and second conductor components 11, 12 to be equally spaced relative thereto, and the second Hall element 22 is located at another center point with an equal distance between the first and third conductor components 11, 13 to be equally spaced relative thereto. In particular, the first and second Hall elements 21, 22 are equally spaced from the first conductor component 11. Further still, the flux sensitive surface of each Hall element is substantially aligned with the plane involving the diverging point O, and is oriented in the same direction.

Now, the operation of the sensor section of the current detection device of the preferred embodiment according to the present invention is described below in detail.

Assume that the magnitude of electric current flowing through the first conductor component 11 is $I_1$, the magnitude of electric current flowing through the second conductor component is $I_2$ and the magnitude of electric current flowing through the third conductor component $I_3$. Also, assume that the angle between the second and third conductor components 12, 13 is $\theta_1$, the angle between the first and second conductor components 11, 12 is $\theta_2$ and the angle between the first and third conductor components 11, 13 is $\theta_3$. With these parameters, determining an equation $\theta_2=\theta_3$, the following equation (1) is established as:

$$\theta_2 = \theta_3 = \frac{1}{2}(2\pi - \theta_1) = \pi - \frac{1}{2}\theta_1 \tag{1}$$

Also, in case of n ($0 \leq n \leq 1$) where n is the shunt current ratio, the following equations (2) and (3) are obtained as:

$$I_2 = -nI_1 \tag{2}$$

$$I_3 = (n-1)I_1 \tag{3}$$

Also, using Kirchhoff's equations give the following equation:

$$I_1 + I_2 + I_3 = 0 \tag{4}$$

Figure 2:
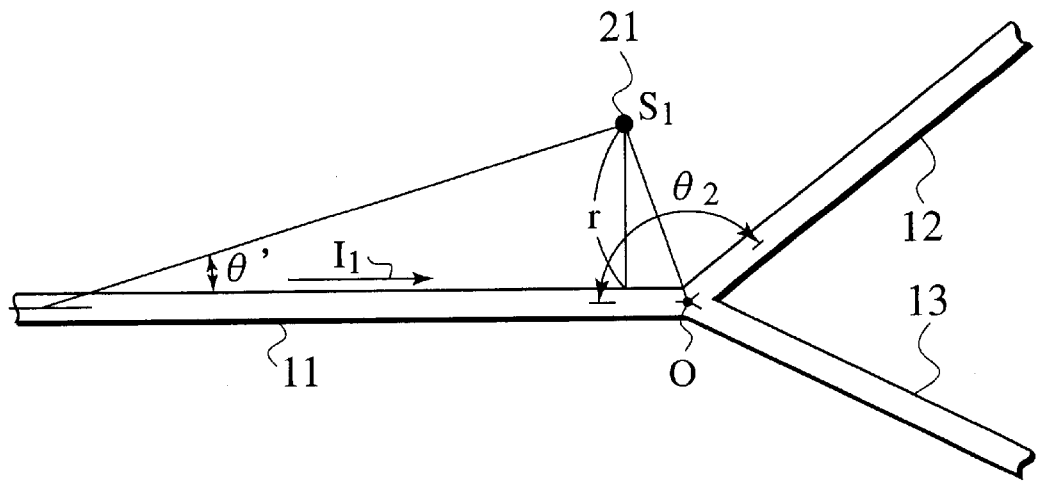
FIG. 2 is a schematic view for illustrating a calculation method of magnetic fields, caused by electric currents flowing through first and second conductor components, which a first Hall element undergoes.

Now, a calculation method for the magnetic field incident on the first and second Hall elements 21, 22 is described below in detail. First, the calculation method for the magnetic field incident on the first Hall element 21 is described below with reference to FIG. 2. The magnitude of the magnetic field incident on the first Hall element 21 is calculated each for electric current. The magnetic field incident on the first Hall element 21 due to electric current $I_1$ is expressed as:

$$\frac{I_1}{4\pi r}\left(\cos\frac{\theta_2}{2} + \cos\theta'\right) \tag{5}$$

Here, $\theta'$ is the angle formed between the first conductor component 11 and a line intersecting a left end portion of the first conductor component 1 and the first Hall element 21, and r is the length between the first Hall element 21 and the first conductor component 11. When r has a sufficiently smaller value than the length of the first conductor component 11, since $\theta'=0$, an equation $\cos\theta'=1$ is established.

Thus, the aforementioned magnetic field is expressed by the following equation (6):

$$\frac{I_1}{4\pi r}\left(1 + \cos\frac{\theta_2}{2}\right) \tag{6}$$

Further, substituting the equation (1) into the equation (6) yields the following:

$$\frac{I_1}{4\pi r}\left\{1 + \cos\left(\frac{1}{2}\left(\pi - \frac{1}{2}\theta_1\right)\right)\right\} \tag{7}$$

$$= \frac{I_1}{4\pi r}\left\{1 + \cos\left(\frac{1}{2}\pi - \frac{1}{4}\theta_1\right)\right\}$$

$$= \frac{I_1}{4\pi r}\left\{1 + \cos\frac{1}{2}\pi \cdot \cos\frac{1}{4}\theta_1 + \sin\frac{1}{2}\pi \cdot \sin\frac{1}{4}\theta_1\right\}$$

$$= \frac{I_1}{4\pi r}\left(1 + \sin\frac{1}{4}\theta_1\right)$$

which represents the magnetic field due to electric current $I_1$ and incident on the first Hall element 21.

Furthermore, the magnetic field due to electric current $I_2$ and incident on the first Hall element 21 like the magnetic field due to electric current $I_1$ and incident on the first Hall element 21 is expressed by the following equation (8):

$$-\frac{I_2}{4\pi r}\left(1 + \sin\frac{1}{4}\theta_1\right) \tag{8}$$

Here, substituting the equation (2) into the equation (8) leads the following equation (9):

$$\frac{nI_1}{4\pi r}\left(1 + \sin\frac{1}{4}\theta_1\right) \tag{9}$$

which represents the magnetic field due to electric current $I_2$ and incident on the first Hall element 21.

Figure 3:
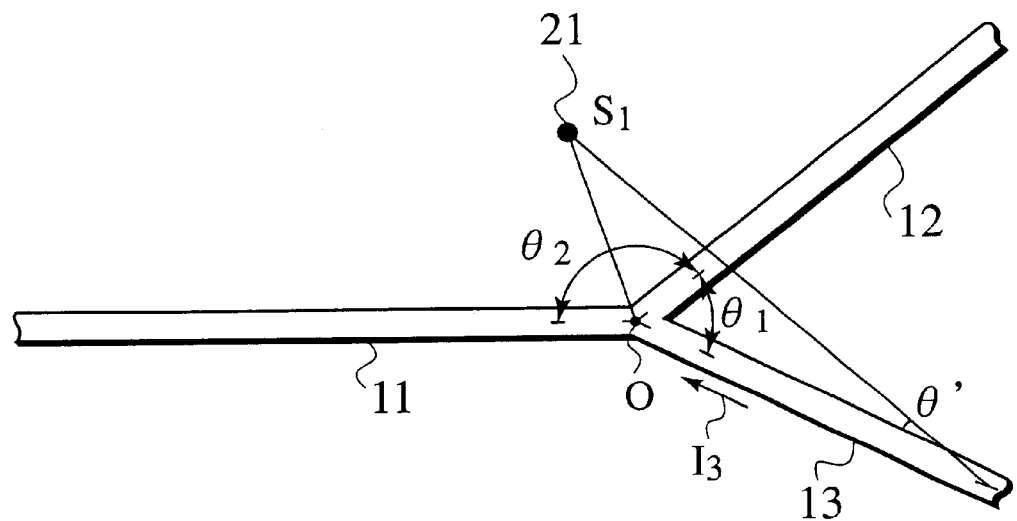
FIG. 3 is a schematic view for illustrating a calculation method of a magnetic field, caused by electric current flowing through third conductor component, which the first Hall element undergoes.

Now, a calculation method for the magnetic field incident on the first Hall element 21 due to electric current $I_3$ is described below in detail with reference to FIG. 3. First, the magnitude of the magnetic field incident on the first Hall element 21 due to electric current $I_3$ is expressed as:

$$\frac{I_3}{4\pi r}\left[\cos\left(\theta_1 + \frac{1}{2}\theta_2\right) + \cos\theta'\right] \tag{10}$$

Here, using the equations (1) and (3) and the equation $\cos \theta' = 1$ yields the following equation (11):

$$-\frac{I_3}{4\pi r}\left\{1 + \cos\left[\theta_1 + \frac{1}{2}\left(\pi - \frac{1}{2}\theta_1\right)\right]\right\} \quad (11)$$

$$= -\frac{I_3}{4\pi r}\left[1 + \cos\left(\frac{1}{2}\pi + \frac{3}{4}\theta_1\right)\right]$$

$$= -\frac{I_3}{4\pi r}\left[1 + \cos\frac{1}{2}\pi \cdot \cos\frac{3}{4}\theta_1 - \sin\frac{1}{2}\pi \cdot \sin\frac{3}{4}\theta_1\right]$$

$$= -\frac{I_3}{4\pi r}\left(1 - \sin\frac{3}{4}\theta_1\right)$$

which represents the magnetic field due to electric current $I_3$ and incident on the first Hall element 21.

Next, combining three magnetic fields thus obtained in a manner discussed above yields the magnitude of the magnetic field incident on the first Hall element 21. Here, in case of $\theta_1 \geq 2\pi/3$, i.e., when $\theta_1 + \theta_2/2 \geq \pi$, since the orientation of the magnetic field incident on the Hall element 21 due to electric current $I_3$ is opposite, calculating the case of $0 < \theta_1 \leq 2\pi/3$ and the case of $2\pi/3 \leq \theta_1 \leq 2\pi$ separately yields a synthesized magnetic field.

First, in case of $0 < \theta_1 \leq 2\pi/3$, the synthesized magnetic field is expressed as:

$$\frac{1}{4\pi r}\left(1 + \sin\frac{1}{4}\theta_1\right)I_1 - \frac{1}{4\pi r}\left(1 + \sin\frac{1}{4}\theta_1\right)I_2 - \frac{1}{4\pi r}\left(1 - \sin\frac{3}{4}\theta_1\right)I_3 = \quad (12)$$

$$\frac{1}{4\pi r}\left[I_1 - I_2 - I_3 + \sin\frac{1}{4}\theta_1 \cdot (I_1 - I_2) + \sin\frac{3}{4}\theta_1 \cdot I_3\right]$$

Also, in case of $2\pi/3 \leq \theta_1 \leq 2\pi$, the synthesized magnetic field is expressed as:

$$\frac{1}{4\pi r}\left(1 + \sin\frac{1}{4}\theta_1\right)I_1 - \frac{1}{4\pi r}\left(1 + \sin\frac{1}{4}\theta_1\right)I_2 + \frac{1}{4\pi r}\left(1 - \sin\frac{3}{4}\theta_1\right)I_3 = \quad (13)$$

$$\frac{1}{4\pi r}\left[I_1 - I_2 + I_3 + \sin\frac{1}{4}\theta_1 \cdot (I_1 - I_2) - \sin\frac{3}{4}\theta_1 \cdot I_3\right]$$

Now, the synthesized magnetic field incident on the second Hall element 22 is obtained in the same calculation method for the synthesized magnetic field incident on the first Hall element 21. In case of $0 < \theta_1 \leq 2\pi/3$, the synthesized magnetic field is expressed as:

$$-\frac{1}{4\pi r}\left(1 + \sin\frac{1}{4}\theta_1\right)I_1 + \frac{1}{4\pi r}\left(1 + \sin\frac{1}{4}\theta_1\right)I_3 + \frac{1}{4\pi r}\left(1 - \sin\frac{3}{4}\theta_1\right)I_2 = \quad (14)$$

$$\frac{1}{4\pi r}\left[-I_1 + I_2 + I_3 + \sin\frac{1}{4}\theta_1 \cdot (-I_1 + I_3) - \sin\frac{3}{4}\theta_1 \cdot I_2\right]$$

Also, in case of $2\pi/3 \leq \theta_1 \leq 2\pi$, the synthesized magnetic field is expressed as:

$$-\frac{1}{4\pi r}\left(1 + \sin\frac{1}{4}\theta_1\right)I_1 + \frac{1}{4\pi r}\left(1 + \sin\frac{1}{4}\theta_1\right)I_3 - \frac{1}{4\pi r}\left(1 - \sin\frac{3}{4}\theta_1\right)I_2 = \quad (15)$$

$$\frac{1}{4\pi r}\left[-I_1 - I_2 + I_3 + \sin\frac{1}{4}\theta_1 \cdot (-I_1 + I_3) + \sin\frac{3}{4}\theta_1 \cdot I_2\right]$$

Further, a difference in the magnetic field between the synthesized magnetic field incident on the first Hall element 21 and the synthesized magnetic field incident on the second Hall eminent 22 is obtained in a manner described below. First, in case of $0 < \theta_1 \leq 2\pi/3$, subtracting the equation (14) from the equation (12) yields a differential magnetic field as expressed by the 20 following equation (16):

$$\frac{1}{4\pi r}\left(4 + 3 \cdot \sin\frac{1}{4}\theta_1 - \sin\frac{3}{4}\theta_1\right)I_1 \quad (16)$$

Also, in case of $2\pi/3 \leq \theta_1 \leq 2\pi$, subtracting the equation (15) from the equation (13) yields the differential magnetic field as expressed by the following equation (17):

$$\frac{1}{4\pi r}\left(2 + 3 \cdot \sin\frac{1}{4}\theta_1 + \sin\frac{3}{4}\theta_1\right)I_1 \quad (17)$$

Here, referring to the equations (16) and (17), it appears that these equations do not involve the shunt current ratio n. It will thus be understood that the differential magnetic field obtained in the calculation method described above is not influenced with the shunt current ratio.

From the equations (16) and (17), it appears that since r is determined with the positions of the first and second Hall elements 21, 22 and $\theta_1$ is determined with the configuration of the three legged electrical conductor 10 formed with the first, second and third conductor components 11, 12, 13, the differential magnetic field varies in proportion to electric current $I_1$ flowing through the first conductor component 11. Accordingly, detecting output voltages produced at the first and second Hall elements 21, 22 enables detection of electric current $I_1$ flowing through the first conductor component 11.

Further, even in the presence of magnetic field disturbances in the vicinity of the first and second Hall elements 21, 22, respectively, calculating the differential magnetic field leads a result in that a magnetic flux incident on the flux sensitive surface of the first Hall element 21 and a magnetic flux incident on the flux sensitive surface of the second Hall element 22 are cancelled each other. As a consequence, an advanced advantage of the present invention concerns an accurate detection of electric current flowing through the first conductor component 11 even in a case where the current detection device of the present invention is used in an environment in the presence of the magnetic field disturbances present around the first and second Hall elements 21, 22.

An advanced feature of the current detection device of the present invention concerns the presence of the synthesized magnetic field which is applied to the flux sensitive surfaces of the first and second Hall elements 21, 22 on the basis of the first magnetic flux caused by electric current $I_1$ flowing through the first conductor component 11, the second magnetic flux caused by electric current $I_2$ flowing through the second conductor component 12 and the third magnetic flux caused by electric current $I_3$ flowing through the third conductor component 13, with a resultant capability of permitting detection of electric current $I_1$ flowing through the first conductor component 11 with a higher resolution property than that obtained in the state-of-the-art current detection device adapted to detect electric current with two Hall elements located at both sides of a linear electric conductor.

Figure 4:
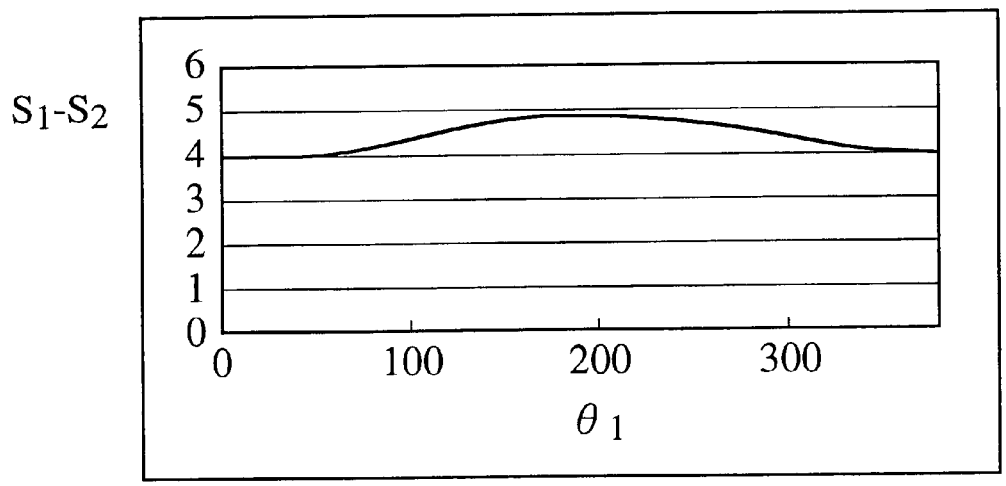
FIG. 4 is a graph for illustrating a differential magnetic field to be detected by the current detection device according to the present invention.

Now, formalizing $I_1/(4\pi r)$ as "I" and formalizing the value of the differential magnetic field as a function of $\theta_1$, the differential magnetic field will vary in dependence on the variation in $\theta_1$ as seen in FIG. 4. This differential magnetic field becomes maximum value when $\theta_1 = \pi$. That is, it is possible to obtain the greatest gain when the three legged electric conductor 10 has three conductor components angled at 90 degrees. Accordingly, forming the three legged electrical conductor with the first, second and third conductor components 11, 12, 13 configured in a T-shaped profile enables detection of electric current with the greatest sensitivity.

Another advantage of the current detection device of the present invention concerns the use of the same number of the Hall elements as the state-of-the-art current detection device wherein the two Hall elements are located at both sides of the linear electrical conductor, thereby avoiding an increase in the manufacturing cost of the current detection device.

Comparison tests have been conducted to confirm a difference in the current detecting sensitivity between the linear electric conductor employed in the state-of-the art current detection device and the T-shaped electric conductor employed in the current detection device of the present invention, with the test results being described below in detail.

First, the output voltage of 0.57 volts was produced on the basis of the differential magnetic field produced when the linear electric conductor was supplied with electric current of 50 A. On the other hand, the output voltage of 0.68 volts was produced on the basis of the differential magnetic field produced when the T-shaped electric conductor was supplied with electric current of 50 A. From these test results, the ratio in the detecting sensitivity is obtained as $0.68/0.57 \approx 1.2$. Also, the output voltage of 0.91 volts was produced on the basis of the differential magnetic field produced when the linear electric conductor is supplied with electric current of 80 A. On the other hand, the output voltage of 1.09 volts was produced on the basis of the differential magnetic field produced when the T-shaped electric conductor was supplied with electric current of 80 A. From these test results, the ratio in the detecting sensitivity is obtained as $1.09/0.91 \approx 1.2$. It will thus be understood that the ratio of the current detecting sensitivity remains in a value of 1.2 regardless of the magnitude of electric current flowing through the conductor.

Now, obtaining the current detection sensitivity using the aforementioned equations, in case of the linear conductor, since "$\theta_1=0$", substituting this equation into the equation (16) yields a value of "4". Also, in case of the linear conductor, "$\theta_1=\pi$", substituting this equation into the equation (17) yields the formula "$2+3/\sqrt{2}-1/\sqrt{2}$". As a consequence, the current detecting sensitivity ratio is expressed as "$4/(2+3/\sqrt{2}-1/\sqrt{2}=1.207$. As such, it appears that the equations for obtaining the differential magnetic field, conducted in the manner discussed above, are in coincidence with the test results discussed above.

Figure 5:
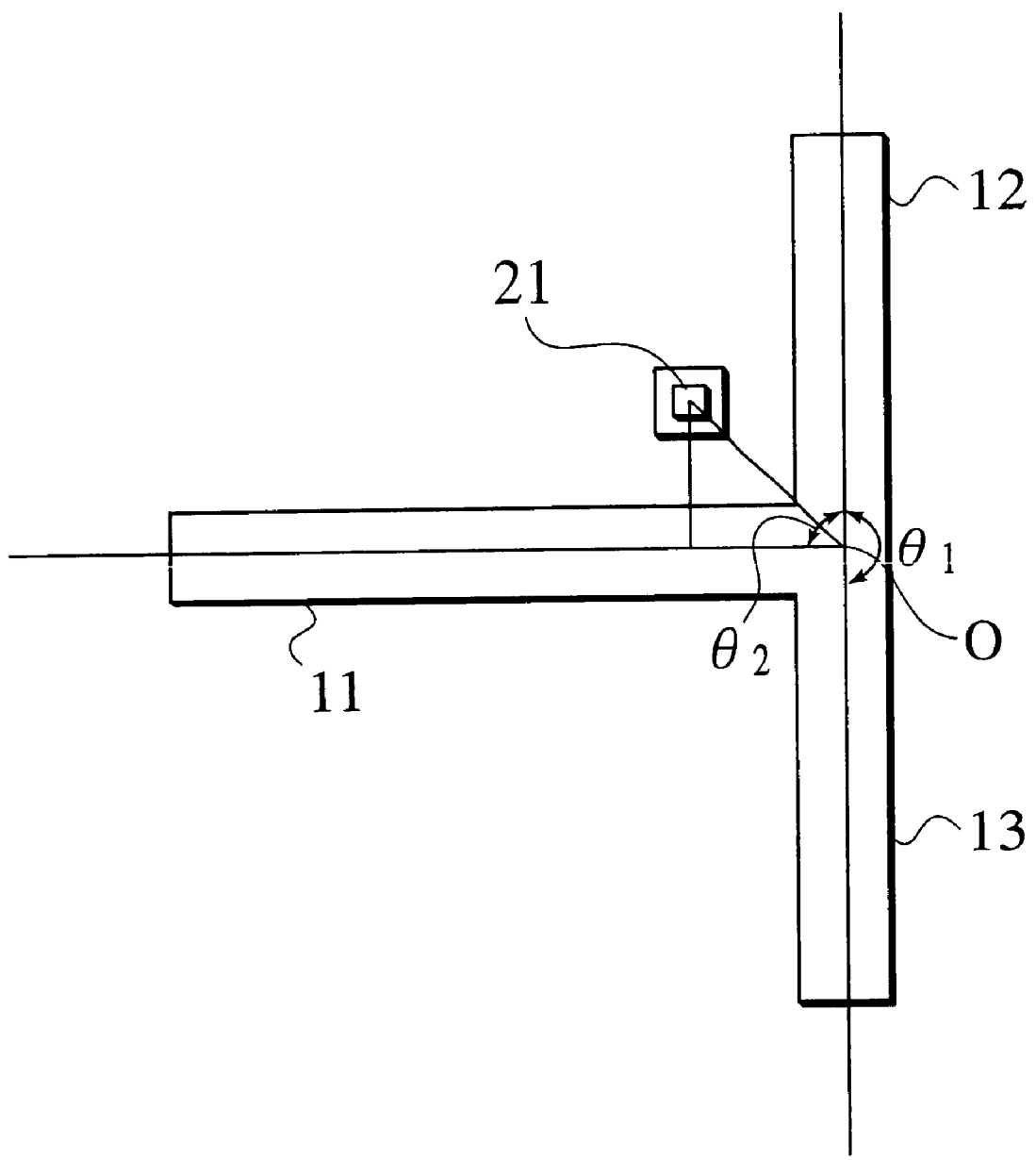
FIG. 5 is a plan view of a T-shaped electric conductor wherein the first and second conductor components are angled at 90 degrees.

Now, formalizing $I_1/(4\pi r_{min})$ as "I" and formalizing the value of the differential magnetic field as a function of $\theta_1$, it will be seen that in case of $\theta_1=\pi$, i.e., when the three legged conductor components are diverged at right angles as shown in FIG. 5, the greatest gain is obtained.

Figure 6A:
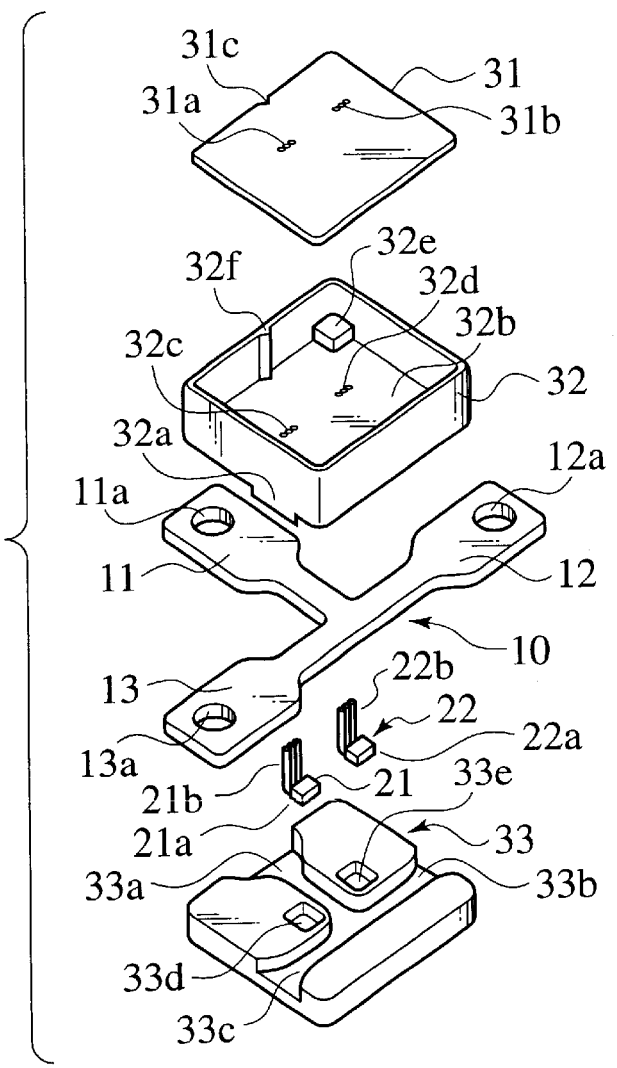
FIG. 6A is an exploded perspective view of the current detection device of the preferred embodiment according to the present invention.

FIG. 6A is an exploded perspective view of a structure of the current detection device of the preferred embodiment according to the present invention incorporating the principal concept discussed above, and FIG. 6B is a perspective view of an outer appearance of the current detection device wherein a sensor substrate is removed for the sake of simplicity, with like parts bearing the same reference numerals as those used in FIG. 1.

Figure 6B:
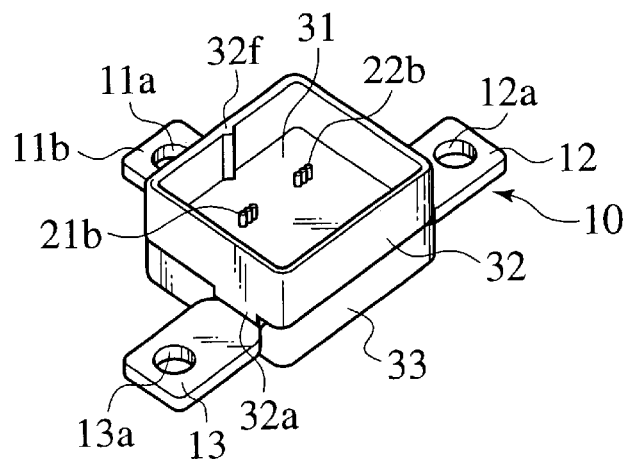
FIG. 6B is a perspective view of the current detection device of the preferred embodiment according to the present invention.

As shown in FIGS. 6A and 6B, the current detection device, which is generally designated at 20, includes an enclosure case 30 composed of a sensor case component 32, a lower case component 33 fixedly coupled to the sensor case component 32, and a top cover component which is not shown for the sake of simplicity.

The lower case component 33 serves as a base for the case 30 and has a T-shaped positioning recess components 33a, 33b, 33c for receiving the first, second and third conductor components 11, 12, 13, respectively, with each recess component having substantially the same depth as the thickness of the three legged electric conductor 10. The lower case component 33 also has a pair of positioning concave portions 33d, 33e which are equally spaced from a center line of the first conductor component 11 in close proximity to the diverging point O of the electric conductor 10 for the reason as discussed above and which accommodates therein the first and second Hall elements 21, 22, respectively, such that they are spaced from the first conductor component 11 with an equal distance.

The first Hall element 21 has a sensor body 21a and an upright terminal 21b. Likewise, the second-Hall element 22 has a sensor body 22a and an upright terminal 22b.

The sensor case component 32 has the same outer shape as the lower case component 33 and has downwardly extending, positioning flanges 32a, 32a (only one of which is shown) which serve as stops to retain intermediate portions of the second and third conductor components 12, 13 in fixed places, respectively. The sensor case component 32 has a flat wall 32b which is formed with a pair of spaced positioning apertures 32c, 32d to accommodate therein the terminals 21b, 22b of the first and second Hall elements 21, 22.

A pair of spacer elements 32e, 32e (only one of which is shown) are located at corners of the sensor case component 32 above the flat wall 32b. An inward projection 32f, which serves as a positioning guide, vertically extends at an inner wall of the sensor case component 32 and serves as a positioning element.

A sensor substrate 31, which is to be placed on the spacer elements 32e, 32e of the sensor case component 32, has a pair of spaced positioning apertures 31a, 31b through which respective upper portions of the terminals 21b, 22b extend upward for electrical connection with leads (not shown), and a positioning cutout 31c formed at a central portion of a rearward edge of the sensor substrate 31 and adapted to mate with the inward projection 32f of the sensor case component 32.

It is to be noted that each of the sensor case component 32 and the lower case components 33 is made of a molded frame formed of electrically insulating material.

As seen in FIG. 6A, the three legged electrical conductor 10 includes three conductor components 11, 12, 13 formed with terminal bores 11a, 12a, 13a, respectively, to be coupled to a suitable electrical equipment as will be described later.

During assembly of the current detection device, the three legged electric conductor 10 is first placed in the T-shaped positioning recess components 33a, 33b, 33c, and the first and second Hall elements 21, 22 are located in the corresponding concave portions 33d, 33e of the lower case component 33. Subsequently, the sensor case component 32 is fitted to the lower case component 33 so as to hold the T-shaped electric conductor 10 in a fixed place. Then, the sensor substrate 31 is located in the sensor case component 32 and placed over the spacer elements 32e, 32e, thereby completing the assembling process. During this assembling process, the terminals 21b, 22b of the first and second Hall elements 21, 22 extend through the apertures 32c, 32d of the flat wall 32b of the sensor case component 32 and the apertures 31a, 31b of the sensor substrate 31. Further, the cutout 31c of the sensor substrate 31 is guided by the inward projection 32f of the sensor case component 32 such that the sensor substrate 31 is fixedly retained in a fixed position within the sensor case component 32. As previously noted, when the sensor case component 32 is fitted to the lower case component 33, the downwardly extending flanges 32a, 32a of the sensor case component 32 are bought into abutting engagement with the intermediate portions of the second and third conductor components 12, 13, respectively, to hold the same in fixed places.

When such an assembling process of the current detection device 30 is completed, as seen in FIG. 6A, end portions of the respective terminals 21b, 22b of the first and second Hall elements 21, 22 protrude outward from the slits 31a, 31b of the sensor substrate 31. Though not shown in the drawings, the sensor substrate has a printed circuit pattern including a calculation process circuit 40, which will be described later in detail, responsive to a first electric signal delivered from the first Hall element 21 and a second electric signal produced by the second Hall element 22 for detecting electric current flowing through the first conductor component 11. To this end, the calculation process circuit 30 has input terminals adapted to be supplied with the first and second electric signals delivered from the first and second Hall elements 21, 22, respectively.

With the current detection device in such a structure, mere assembling of the T-shaped electric conductor 10, and the first and second Hall elements 21, 22 into the enclosure case 30 provide an ease of positioning of the electric conductor 10 and the sensors and an increased dimensional precision to effectuate a highly accurate detection of current flowing through the electric conductor.

Another important advantage of the current detection device of the present invention concerns the enclosure case 30 constructed of the sensor case component 32 and the lower case component 33 which are made of electrically insulating material whereby it is possible to avoid the disturbance of magnetic flux that would otherwise be caused by electric current flowing through the case components if they are made of conductive material. This results in capability of highly accurate detection of electric current.

Figure 7:
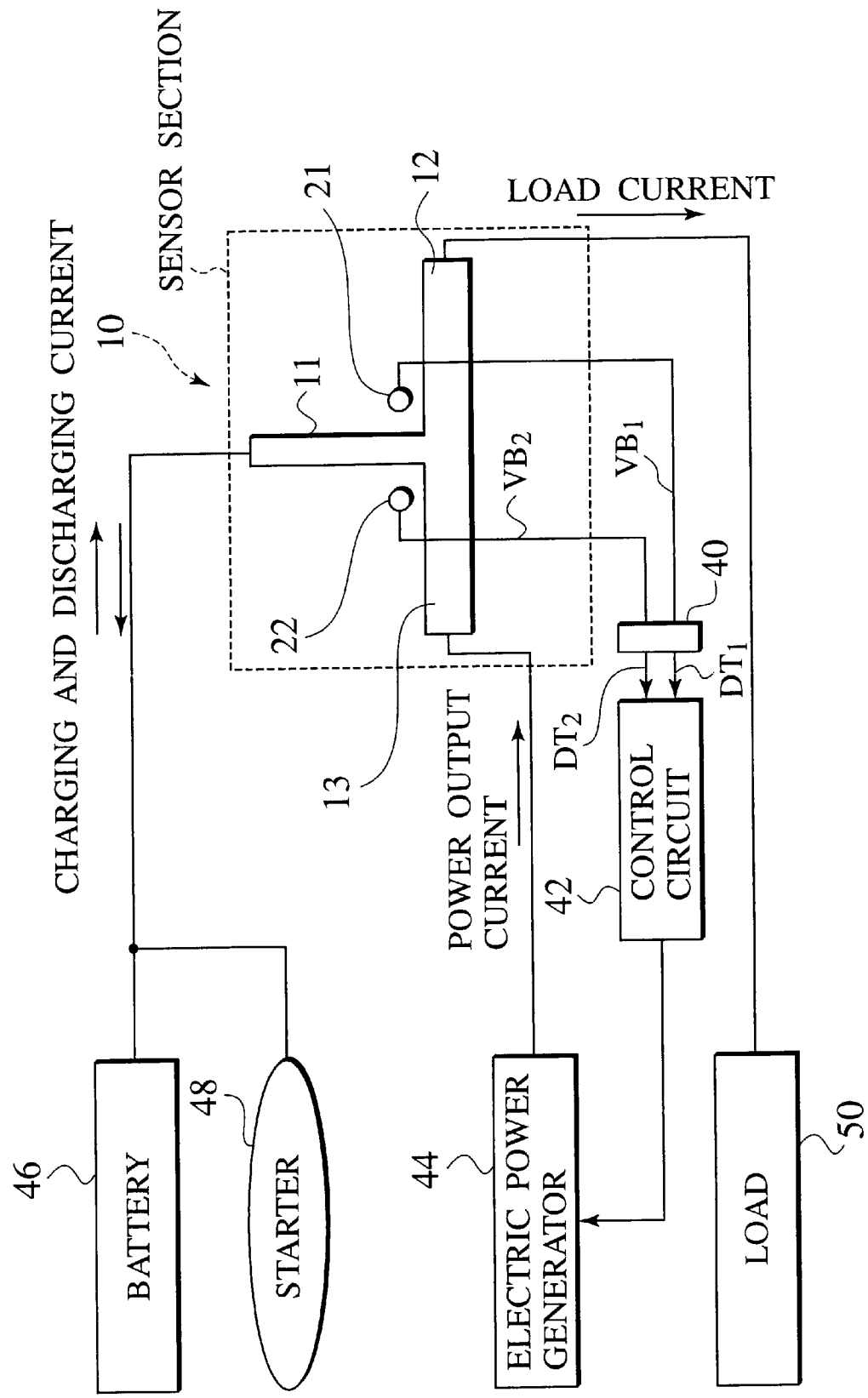
FIG. 7 is a block diagram of a power supply system using the current detection device according to the present invention.

An example of the current detection device of the present invention applied to an automotive power supply system is described in detail below with respect to FIG. 7. The automotive power supply system, which is generally designated at 50, incorporates therein the current detection device 10 of the present invention. In particular, the automotive power supply system 50 includes the aforementioned current detection device 10 (including the calculation processor circuit 40), a control circuit 42, an electric power generator 44, a battery 46, a starter 48 ad a load 50. The first conductor component 11 is connected to the battery 46, to which the starter 48 is also connected. The second conductor component 13 is connected to the electric power generator 44, and the third conductor component 13 is connected to the load 50 to provide an electrical connection between the electric power generator 44 and the load 50 through the second and third conductor components 12, 13. The calculation processor circuit 40 is responsive to electric signals VB1, VB2 produced by the first and second Hall elements 21, 22 and produces first and second detection signals DT1, DT2. The starter 48 functions to control the turning-on or turning-off between the battery 46 and the first conductor component 11 of the current detection device 10.

The control circuit 42 is constructed of a Central Processing Unit (CPU). The control circuit 42 functions to discriminate current status of the electric circuit on the basis of the first and second detection signals $DT_1$, $DT_2$ delivered from the calculation processor circuit 40 and to control the operation of the electric power generator 44 so as to meet required operating condition. The load may include a head lamp, a wiper drive mechanism, etc.

With such an electric circuit for the automotive vehicle, it is possible for the control circuit 42 to be arranged so as to totally evaluate the first and second detection signals $DT_1$, $DT_2$ for thereby producing a suitable command to control the electric power generator 44 in dependence on the operating condition of the load and the charged state of the battery 46.

It will now be appreciated from the foregoing description that in accordance with a first advanced feature of the present invention, the presence of the first and second magneto-electric conversion elements located at the both sides of the first conductor component in the vicinity of the diverging point of the electrical conductor enables a differential result between two electric signals produced by these magneto-electric elements to be effectively utilized for accurately detecting electric current flowing through the first conductor component. Since, in this instance, the two magneto-electric elements respond to both the magnetic flux caused by electric current flowing through the first conductor component at a location upstream of the diverging point and the magnetic flux caused by electric current flowing at locations downstream of the diverging point of the electrical conductor, even when the magnitude of electric current, which becomes an object to be detected, flowing through the first conductor component 11 remains at a constant value, the magneto-electric elements convert a larger amount of magnetic fluxes into an electrical product than that effectuated with electric current flowing through the single linear conductor. As a consequence, it is possible for the current detection device of the present invention to achieve detection of electric current flowing through the first conductor component in a highly accurate manner even with a small magnitude of electric current flowing through the same.

Another important advantage of the current detection device of the present invention concerns a noise canceling capability to provide an increased reliability in current detection with the use of a differential electric signal between two output signals produced by the two magneto-electric elements without being adversely affected with the magnetic flux disturbances that would otherwise occur in the vicinity of the current detection device. This advantage is useful especially when the current detection device is placed in a particular area to detect current flowing through the first conductor component in a highly accurate fashion even in the presence of other conductor components, which produce the magnetic flux disturbances, located in close proximity to the first conductor component. Since the current detection device of the present invention employs the same number of magneto-electric transducer elements as the state-of-the-art current detection device adapted to detect current flowing through the single linear conductor component, it is possible for the current detection device of the present invention to be manufactured at nearly the same cost as the state-of-the-art current detection device, yet providing a highly accurate current detection capability.

A further important advantage of the current detection device according to the present invention concerns a unique technology to basically enable the omission of a flux concentration core to allow the current detection device to be manufactured in a miniaturized structure in reduced weight and in low cost.

An important feature of the current detection device of the present invention concerns the electric conductor which is constructed of the three legged structure having the first, second and third conductor components oriented at the angle of 90 degrees with respect to one another to enable the current detection with the highest accuracy.

A still further important advantage of the current detection device of the present invention concerns the miniaturization and the low cost of the device to allow the power supply system to be manufactured in a small size with a low cost.

A still further important advantage of the current detection device of the present invention concerns the utilization of the device for detecting charging or discharging state of the battery with the greatest sensitivity to allow the amount of electric power output of the electric power generator to be accurately controlled.

A still further important advantage of the current detection device of the present invention concerns the ease of assembly of the device with the use of the T-shaped electric conductor formed in a unitary structure, the first and second magneto-electric transducer elements, the sensor substrate and the enclosure case made of the molded frames which are assembled in a simple manner to easily position the component parts with respect to one another to increase the dimensional precision to facilitate accurate detection of electric current.

What is claimed is:

1. A current detection device comprising:

an electric conductor placed in a plane and having first, second and third conductor components extending from a common diverging point in three orientations with a given angle with respect to one another;

first and second magnet-electric transducer elements located at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor; and a calculation processor circuit responsive to a differential value between the first and second electric signals for thereby detecting electric current flowing through the first conductor component.

2. The current detection device according to claim 1, wherein the first, second and third conductor components are angled at 90 degrees with respect to one another to form a T-shaped three legged structure.

3. A method for detecting electric current, comprising:

locating an electric conductor composed of first, second and third conductor components extending from a common diverging point in three orientations angled at a given angle with respect to one anther;

locating first and second magnet-electric transducer elements at both sides of the first conductor component in positions equally spaced from the first conductor component and in the vicinity of the diverging point for producing first and second electric signals in response to magnetic fluxes caused by electric currents flowing through the first, second and third conductor components, with each transducer element having a flux sensitive surface aligned in the plane of the electric conductor; and calculating a differential value between the first and second electric signals for thereby detecting electric current flowing through the first conductor component.

4. The method for detecting electric current according to claim 3, wherein the first, second and third conductor components are angled at 90 degrees with respect to one another to form a T-shaped three legged structure.

* * * * *

UNITED STATES PATENT AND TRADEMARK OFFICE
CERTIFICATE OF CORRECTION

PATENT NO. : 6,646,429 B2  Page 1 of 1
DATED : November 11, 2003
INVENTOR(S) : Takashi Gohara et al.

It is certified that error appears in the above-identified patent and that said Letters Patent is hereby corrected as shown below:

<u>Title page, Item [54] and Column 1, line 2,</u>
"OF" should read -- FOR --.

Signed and Sealed this

Ninth Day of March, 2004

JON W. DUDAS
*Acting Director of the United States Patent and Trademark Office*